(12) United States Patent
Holberg et al.

(10) Patent No.: US 6,172,361 B1
(45) Date of Patent: Jan. 9, 2001

(54) METHODS FOR MOUNTING AN IMAGER TO A SUPPORT STRUCTURE AND CIRCUITRY AND SYSTEMS EMBODYING THE SAME

(75) Inventors: Douglas Holberg, Wimberley, TX (US); Brannon Harris, San Jose, CA (US)

(73) Assignee: Cirrus Logic, Inc.

( * ) Notice: Under 35 U.S.C. 154(b), the term of this patent shall be extended for 0 days.

(21) Appl. No.: 09/222,025

(22) Filed: Dec. 29, 1998

(51) Int. Cl.⁷ ............................................. H01J 5/02
(52) U.S. Cl. ..................... 250/239; 250/208.1; 257/434
(58) Field of Search ................................ 250/239, 216, 250/208.1, 214.1, 214 LS; 257/291, 432, 433, 434, 435

(56) References Cited

U.S. PATENT DOCUMENTS 5,043,845 * 8/1991 McDermott et al. ................ 361/387

* cited by examiner

Primary Examiner—Que T. Le
(74) Attorney, Agent, or Firm—James J. Murphy, Esq.; J. P. Violette, Esq.

(57) ABSTRACT

The method of mounting a semiconductor device 200 on a supporting structure 101, the semiconductor device having a surface 201 including a defined area 202 for receiving photons and a plurality of conductors 203/204 for establishing connections to the device. An aperture 301 is formed through the supporting structure, the aperture sized to correspond to a size of the defined area of the semiconductor device. Conductors 302 are formed on the supporting structure adjacent to the aperture in a pattern corresponding to the pattern of the conductors on the semiconductor device. The semiconductor device is mounted to the supporting structure such that the conductors on the semiconductor device contact the conductors on the supporting structure where the defined area of the semiconductor device is exposed to photons through the aperture.

25 Claims, 3 Drawing Sheets

6,172,361 B1

METHODS FOR MOUNTING AN IMAGER TO A SUPPORT STRUCTURE AND CIRCUITRY AND SYSTEMS EMBODYING THE SAME

BACKGROUND OF THE INVENTION

1. Field of the Invention

The present invention relates in general to the packaging and assembly of electronic circuitry and in particular to methods for mounting an imager to a support structure and circuitry and systems embodying the same.

2. Description of the Related Art

Charged-coupled device (CCD) imaging is a mature technology which has been used for many years for generating still or video images on any one of a number of display devices. While providing high quality images, CCD imagers have, at least until recently, been expensive. Since the cost of packaging the device was only a small fraction of the overall cost of the CCD imager, no significant efforts were made to trim packaging costs. However, as the cost of CCD imagers has dropped, the packaging costs have correspondingly become a significant factor in the overall cost of the packaged device. This cost factor is particularly relevant to consumer applications, such as digital cameras.

While CCD imagers produce high quality images, for lower cost-lower performance applications, again such as digital cameras, CMOS imagers are frequently used. While producing lower quality images, these imagers are relatively inexpensive, can be integrated onto a single chip along with ancillary circuitry, and allow for some active circuitry to be built within each pixel. In low-performance-low cost applications based on the less expensive CMOS technology, reducing package costs becomes more critical. Additionally, the use of the CMOS technology forces the makers of CCD imaging products to become more focused on reducing package costs.

One specific area where packaging is a significant factor relates to the packaging of the imager and its subsequent marriage to a printed circuit (PC) board or other support/interconnection structure. Presently, some CCD imagers are packaged in a conventional ceramic or plastic packages with a glass lid which allows photons to pass to the CCD element array. For small-format imagers, this type of packaging costs exceeds the cost of the imager chip itself. Moreover, this type of packaging is somewhat bulky and difficult to handle during PC board assembly. CCD imagers have also been packaged in QFP-style packages and in clear mold compound. These options are also not easy implement nor assemble to a PC board.

Thus, the need has arisen for methods of marrying CCD and CMOS imagers and similar photonic sensors to a support/interconnect structure such as a PC board. In addition, these methods should allow for the assembly of circuits and systems which are less expensive and more compact.

SUMMARY OF THE INVENTION

A method is disclosed for mounting a semiconductor device on a supporting structure, the semiconductor device having a surface including a defined area for receiving photons and a plurality of conductors disposed in a pattern adjacent to the defined area for establishing connections to the device. An aperture is formed through the supporting structure and is sized to correspond to a size of the defined area of the semiconductor device. Conductors are formed on the supporting structure adjacent to the aperture in a pattern corresponding to the pattern of the conductors on the semiconductor device. The semiconductor device is mounted to the supporting structure such that the conductors on the semiconductor device contact the conductors on the supporting structure and the defined area of the semiconductor device is exposed to photons through the aperture.

The present inventive concepts have substantial advantages over the prior art. Among other things, photonic sensitive devices, such as CCD or CMOS imagers, easily can be mounted on a structure, such as a PC board, without the traditional ceramic or plastic package. This in turn, reduces costs and allows for more compact and lower profile on the board surface.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Figure 1A:
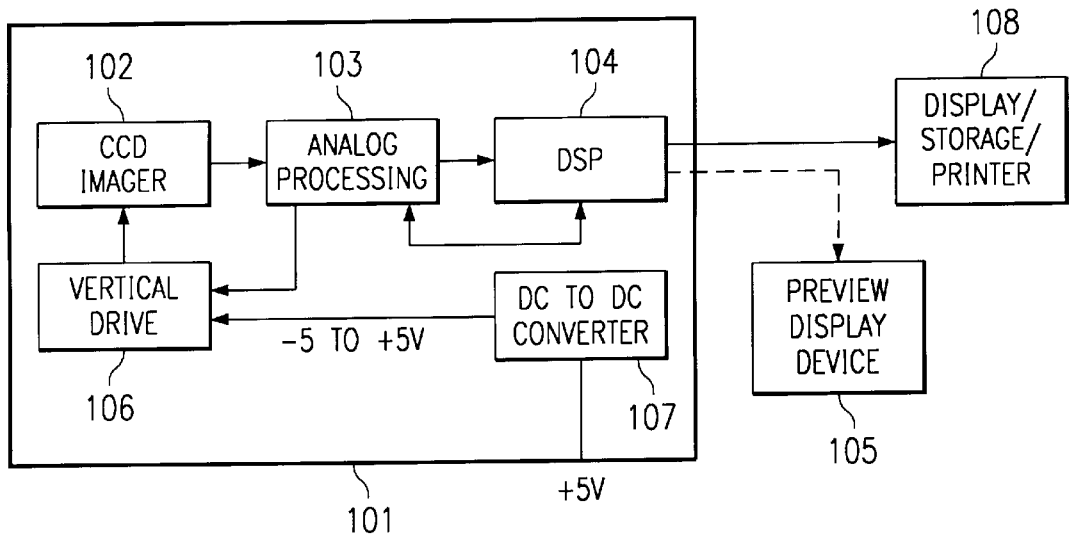
FIG. 1A is a diagram illustrating CCD image processing system for use, for example, in a digital camera, embodying the present inventive concepts.

FIG. 1A is a functional block diagram of exemplary CCD imaging electronics 100, used for instance in digital cameras, disposed on a printed circuit (PC) board 101. Imaging electronics 100 include a CCD imager 102 which converts photons received from an object of interest into electrical signals representing that object. The output of CCD imager 102 is passed to an analog processing device 103 which includes, among other things, a correlated double sampler/variable gain amplifier (CDS/VGA) and an analog data converter (ADC). This chip also generates the timing signals required by imager 102.

The digitized output from analog processing device 103 is processed by digital signal processor (DSP) 104 and then output as video to a display, printer or storage device 108 for printing storage on electronic storage media and/or viewing. The video data may also be used to drive a preview display device 105, such as the LCD panel mounted on the backside of some digital cameras. Imaging electronics 100 also include a vertical drive chip 106 which provides an interface for the exchange of timing signals between analog processing device 103 and CCD imager 102. DC to DC converter 107 generates the voltages required by the system, in response to a +5 V supply voltage.

Figure 1B:
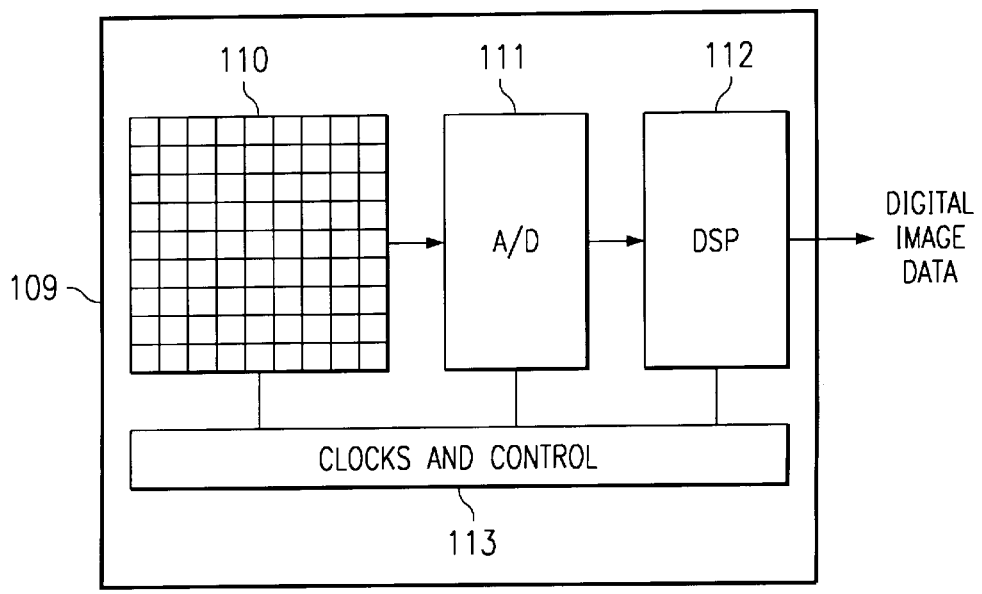
FIG. 1B is a diagram of a CMOS imager device, also suitable for use, for example, in a digital camera.

FIG. 1B depicts an exemplary single-chip CMOS digital imaging subsystem 109. The photonic sensor in this case is an array 110 of CMOS photodiodes. The analog output from photodiode array is converted to digital form by analog to digital (A/D) converters 111. The digitized data is then processed on-chip by digital signal processor (DSP) to generate digital image data for driving a given display device. The typical CMOS imagining chip also includes clock generation and miscellaneous control circuitry 113.

Figure 2A:
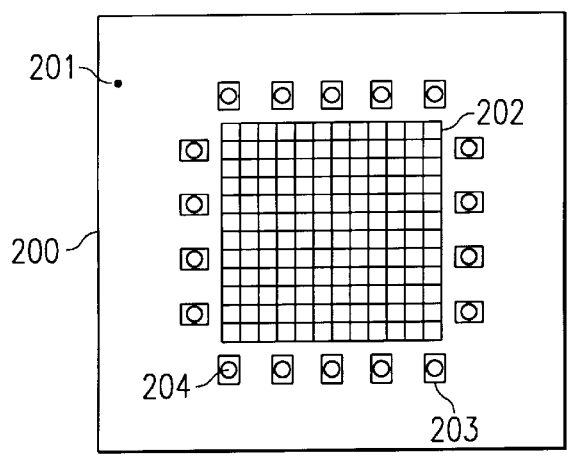
FIGS. 2A and 2B are diagrams of the front and back faces respectively, of an exemplary unpackaged CCD imager die (chip) embodying the present inventive concepts.
Figure 2B:
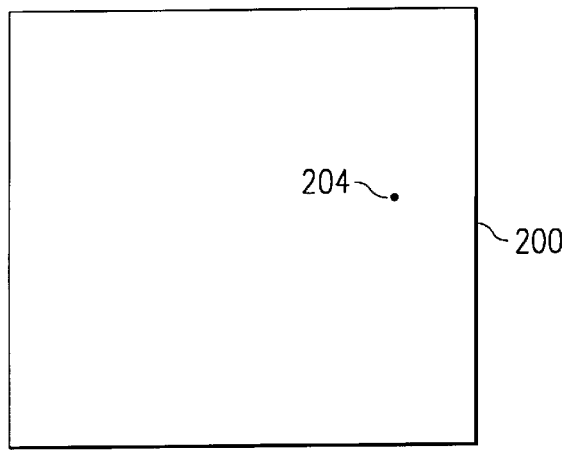

FIGS. 2A and 2B are respectively from and back views of an exemplary unpackaged CCD imager die (chip). In particular, FIG. 2A depicts the front surface (face) 201 including an array 202 of CCD elements. Depicted around the periphery of die 200 are a number of bond pads 203, each of which has been prepared by "bumping" as shown at 204. This "bumping" is performed using one of the techniques known in the packaging art. Generally, the "bumps" are solder balls which reflow on the application of heat, similar to those used in "flip-chip" mounting. The bumps may also be made of gold or similar metal, although solder is still required to make the chip to board electrical connections. Bond pads 203 and bumps 202 provide for signal transfers between external devices, such as analog processing circuitry 103 and vertical drive 106 shown in FIG. 1, and the circuitry of die 200. FIG. 2B generally shows that the back face of die 200 is a generally flat surface 204.

Figure 3A:
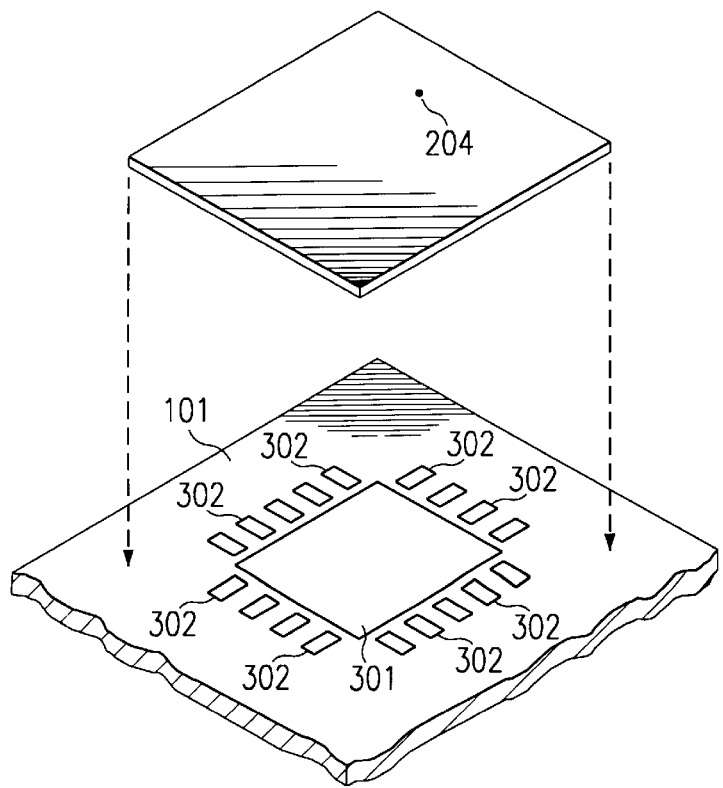
FIG. 3A is a diagram of an enlarged section of the PC board of FIG. 1 in the area where an unpackaged die is to be mounted.
Figure 3B:
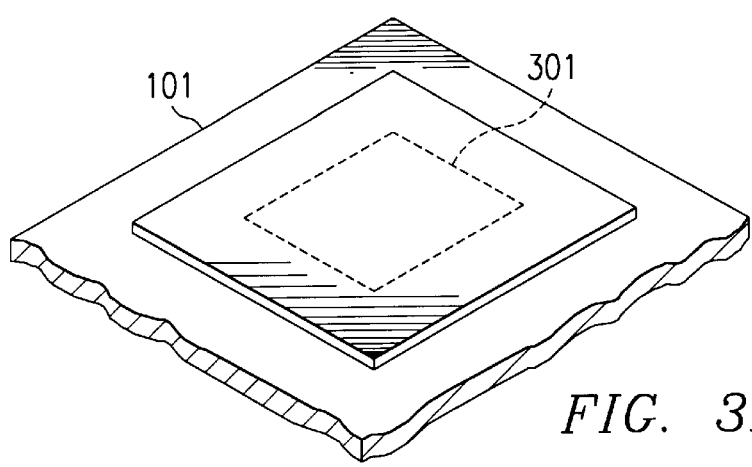
FIG. 3B is a diagram showing the back face of the die after soldering to the PC board.

FIG. 3A shows an enlarged section of PC board 100 in the area where unpackaged die 200 is to be mounted. PC board includes an aperture 301 which corresponds to, and is slightly larger than array 202 on die 200. Aperture 301 provides a window to the CCD element array through which photons pass. The PC board traces 302 also correspond in position to bumps 203 and bond pads 204 on die 200. Die 200 is then placed front face 201 down over aperture and the corresponding bumps 204 and PC board traces 301 soldered together to make the appropriate electrical connections. FIG. 3B shows die 200 after soldering to board 101.

Figure 3C:
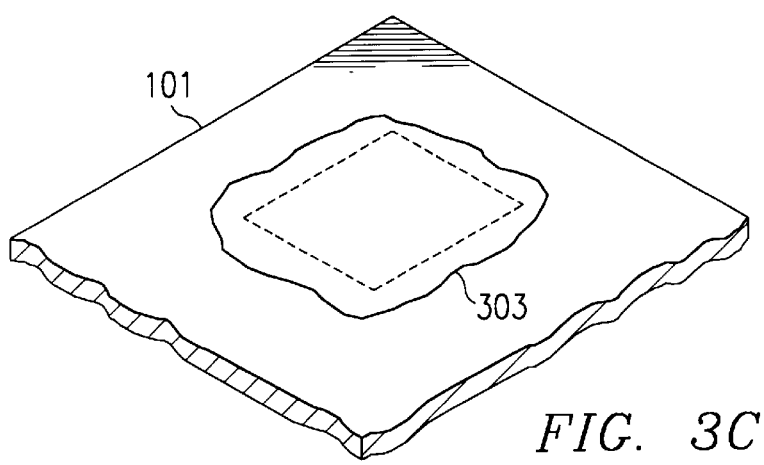
FIG. 3C is a diagram showing a layer of epoxy or similar sealant applied over the back face of die and the adjacent surface areas of PC board, after mounting to the PC board.
Figure 3D:
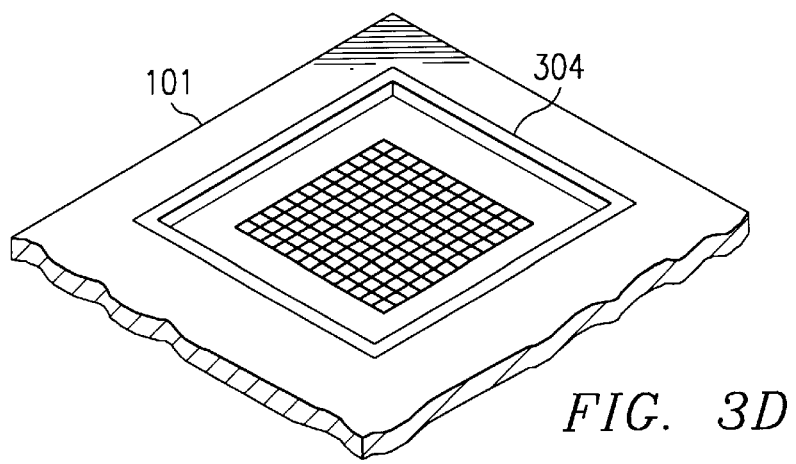
FIG. 3D is a diagram illustrating the completed assembly, with the PC board flipped-over to show the front face of the imager.

After mounting to the PC board, a layer 303 of epoxy or similar sealant is applied over surface 204 of die 200 and the adjacent surface areas of PC board 101 as shown in FIG. 3C The completed assembly, with the PC board flipped-over is shown in FIG. 3D. The CCD elements of imager die 200 are now visible through the aperture, which is shown covered with a sheet of a sheet of transparent material, such as glass or plastic, or a lens 304.

The inventive methods, as well as the circuits and systems fabricated using such methods, have substantial advantages over the prior art. Among other things, the cost of packaging the die in a conventional ceramic package is eliminated. Moreover, using these methods, a flatter profile and smaller footprint on the board results.

Although the present invention and its advantages have been described in detail, it should be understood that various changes, substitutions and alterations can be made herein without departing from the spirit and scope of the invention as defined by the appended claims.

What is claimed is:

1. A method of mounting a semiconductor device on a supporting structure, the semiconductor device having a surface including a defined area for receiving photons and plurality of conductors disposed in the pattern adjacent to the defined area for establishing connections to the device, the method comprising the steps of:

forming an aperture through the supporting structure, the aperture sized to correspond to a size of the defined area of the semiconductor device;

forming conductors on the supporting structure adjacent to the aperture in a pattern corresponding to the pattern of the conductors on the semiconductor device; and mounting the semiconductor device to the supporting structure such that the conductors on the semiconductor device contact the conductors on the supporting structure and the defined area of the semiconductor device is exposed to photons through the aperture.

2. The method of claim 1 wherein the semiconductor device comprises a CCD imager die and the defined area comprises a CCD element array.

3. The method of claim 1 wherein said step of mounting comprises the substep of soldering the conductors on the semiconductor device with the conductors on the supporting structure.

4. The method of claim 1 and further comprising the step of sealing a backside of the semiconductor device.

5. The method of claim 1 and further comprising the steps of bumping the conductors on the semiconductor device prior to said step of mounting.

6. The method of claim 1 and further comprising the step of covering the aperture and the defined area of the semiconductor with a transparent material.

7. The method of claim 1 wherein the supporting structure comprises a printed circuit board.

8. The method of claim 1 wherein the semiconductor device comprises a CMOS imager die and the defined area comprises an array of photodiodes.

9. Electronic circuitry comprising:

a support structure having an aperture therethrough and a plurality of conductors for establishing electrical connections between devices on said support structure; and an imager on a semiconductor die and having an array of elements and a plurality of conductors for establishing electrical connections thereto, said conductors of said imager soldered to selected said conductors of said support structure fastening said die to said structure such that said aperture exposes said array of said imager.

10. The electronic circuitry of claim 9 and further comprising a layer of epoxy formed across a back surface of said die and surrounding areas of said support structure.

11. The electronic circuitry of claim 9 and further comprising a sheet of transparent material covering said array of elements of said die.

12. The electronic circuitry of claim 10 wherein said sheet of transparent material comprises a lenses.

13. The electronic circuitry of claim 9 wherein said support structure comprises a printed circuit board.

14. The electronic circuitry of claim 9 wherein said conductors on said semiconductor die comprise bond pads.

15. The electronic circuitry of claim 9 wherein said imager comprises a CCD imager.

16. The electronic circuitry of claim 9 wherein said imager comprises a CMOS imager.

17. An imaging system comprising:

a printed circuit board including a plurality of traces for interconnecting electronic components mounted to said board and having an aperture therethrough;

an unpackaged semiconductor imager die having bond pads soldered to selected ones of said traces and an area for receiving light from an object of interest through said aperture through said board and signal processing circuitry for processing signals output from said imager via said selected traces.

18. The system of claim 17 wherein said imager comprises a CCD imager.

19. The system of claim 17 and further comprising a transparent material covering said area of said imager.

20. The system of claim 17 wherein said signal processing circuitry comprises analog signal processing circuitry.

21. The system of claim 17 wherein said signal processing circuitry comprises digital signal processing circuitry.

22. The system of claim 17 wherein said imager comprises a CMOS imager.

23. A method of mounting an unpackaged imager chip on a PC board comprising the steps of:

bumping bond pads on the imager chip;

forming an aperture through the PC board;

disposing a plurality of traces adjacent the aperture;

placing the bumped bond pads adjacent selected traces on the PC board such that a photosensitive array of the imager aligns with an the aperture through the PC board; and soldering the bumped bond pads of the imager chip to the selected traces on the PC board.

24. The method of claim 23 and further comprising the step of fastening a sheet of substantially transparent material across the aperture through the PC board.

25. The method of claim 23 and further comprising the step of forming a layer of sealant over a backside of the imager chip and adjacent areas of the board.

* * * * *

UNITED STATES PATENT AND TRADEMARK OFFICE
CERTIFICATE OF CORRECTION

| | | |
|---|---|---|
| PATENT NO. | : 6,172,361 B1 | Page 1 of 2 |
| APPLICATION NO. | : 09/222025 | |
| DATED | : January 9, 2001 | |
| INVENTOR(S) | : Holberg et al. | |

It is certified that error appears in the above-identified patent and that said Letters Patent is hereby corrected as shown below:

In the drawings, Sheet 2, Fig. 2B, the reference numeral "204" applied to the generally flat surface should read --205--.

In the drawings, Sheet 2, Fig. 3A, the reference numeral "204" applied to the generally flat surface should read --205--.

In the drawings, Sheet 2, Fig. 3A, a reference numeral "101" should be applied to the PC board and a reference numeral "200" should be applied to the die.

Column 1, Line 49, before "implement", insert --to--.

Column 2, Line 12, after "This", insert --,--.

Column 2, Line 59, after "printing" insert --,--.

Column 3, Line 6, after "(DSP)", insert --112--.

Column 3, Line 10, the single occurrence of "from" should read --front--.

Column 3, Line 22, the single occurrence of reference numeral "202" should read --204--.

Column 3, Line 26, the single occurrence of reference numeral "204" should read --205--.

Column 3, Line 27, the single occurrence of reference numeral "100" should read --101--.

Column 3, Line 30, after "than" insert --,--.

Column 3, Line 33, the single occurrence of reference numeral "203" should read --204--.

Column 3, Line 33, the single occurrence of reference numeral "204" should read --203--.

Column 3, Line 39, the single occurrence of reference numeral "204" should read --205--.

UNITED STATES PATENT AND TRADEMARK OFFICE
CERTIFICATE OF CORRECTION

| | | |
|---|---|---|
| PATENT NO. | : 6,172,361 B1 | |
| APPLICATION NO. | : 09/222025 | |
| DATED | : January 9, 2001 | |
| INVENTOR(S) | : Holberg et al. | |

It is certified that error appears in the above-identified patent and that said Letters Patent is hereby corrected as shown below:

Column 3, Line 40. after "3C" insert --:--.

Signed and Sealed this

Twenty-eighth Day of August, 2007

JON W. DUDAS
*Director of the United States Patent and Trademark Office*